(12) United States Patent
Sakurai (10) Patent No.: US 10,629,563 B2
(45) Date of Patent: Apr. 21, 2020

(54) BALL FORMING DEVICE FOR WIRE BONDER

(71) Applicant: KAIJO CORPORATION, Tokyo (JP)

(72) Inventor: Yusuke Sakurai, Tokyo (JP)

(73) Assignee: KAIJO CORPORATION, Tokyo (JP)

( * ) Notice: Subject to any disclaimer, the term of this patent is extended or adjusted under 35 U.S.C. 154(b) by 320 days.

(21) Appl. No.: 15/533,271

(22) PCT Filed: May 3, 2015

(86) PCT No.: PCT/JP2015/063152
§ 371 (c)(1),
(2) Date: Jun. 5, 2017

(87) PCT Pub. No.: WO2016/178285
PCT Pub. Date: Nov. 10, 2016

(65) Prior Publication Data
US 2017/0330854 A1    Nov. 16, 2017

(51) Int. Cl.
*H01L 23/00* (2006.01)
*B23K 11/24* (2006.01)
*B23K 101/40* (2006.01)

(52) U.S. Cl.
CPC ............ *H01L 24/78* (2013.01); *B23K 11/241* (2013.01); *B23K 2101/40* (2018.08);
(Continued)

(58) Field of Classification Search
CPC . H01L 2924/00014; H01L 2224/45099; H01L 2224/78; H01L 2224/78271;
(Continued)

(56) References Cited

U.S. PATENT DOCUMENTS 2,432,529 A * 12/1947 Locke ................. B23K 9/0732
315/199
3,300,683 A * 1/1967 Weishaar ............. B23K 9/1012
219/137 PS
(Continued)

FOREIGN PATENT DOCUMENTS

JP        10163242 A  *  6/1998 ............. H01L 24/45
JP     2001-156102        6/2001
(Continued)

OTHER PUBLICATIONS

JP_2001156102_translation.pdf.*

*Primary Examiner* — Lorne E Meade
*Assistant Examiner* — Ket D Dang
(74) *Attorney, Agent, or Firm* — Rankin, Hill & Clark LLP (57) ABSTRACT

A ball forming device includes a first current control circuit to control discharge current arranged between a leading end of a wire and one electrode of a discharge continuing power source for causing discharge current to flow after dielectric breakdown, a second current control circuit to control shunting of discharge current arranged between a discharge electrode and the other electrode of the discharge continuing power source, and a fixed resistor connected to the second current control circuit in parallel as a shunt and controls current flowing through the second current control circuit, thereby a discharge voltage value is adequately changed.

6 Claims, 8 Drawing Sheets

(52) U.S. Cl.
CPC .............. *H01L 2224/78* (2013.01); *H01L 2224/78271* (2013.01); *H01L 2224/78301* (2013.01); *H01L 2224/85045* (2013.01); *H01L 2924/00014* (2013.01)

(58) Field of Classification Search
CPC . H01L 2224/78301; H01L 2224/85045; H01L 24/78; B23K 11/241; B23K 2101/40; B23K 9/0678; B23K 9/0732; B23K 9/0731
USPC .......... 219/56.1, 137 R, 123, 137.41, 56.21, 219/56.22, 75, 130.31
See application file for complete search history.

(56) References Cited

U.S. PATENT DOCUMENTS

| | | | | |
|---|---|---|---|---|
| 5,214,259 | A * | 5/1993 | Terakado | B23K 20/007 219/130.31 |
| 5,225,658 | A * | 7/1993 | Yamaguchi | B23K 9/06 219/121.39 |
| 2001/0047982 | A1* | 12/2001 | Watanabe | B23K 11/257 219/110 |
| 2005/0219777 | A1* | 10/2005 | Sasakura | B23K 20/007 361/42 |

FOREIGN PATENT DOCUMENTS

| | | | | |
|---|---|---|---|---|
| JP | 2001156102 A | * | 6/2001 | ............. H01L 24/78 |
| JP | 2009-277813 | | 11/2009 | |

* cited by examiner

FIG. 8

BALL FORMING DEVICE FOR WIRE BONDER

TECHNICAL FIELD

The present invention relates to a ball forming device for a wire bonder for forming a ball at a leading end of a wire with discharge energy, and in particular, relates to a ball forming device for a wire bonder capable of adequately changing a discharge voltage value in a ball forming process.

BACKGROUND ART

Conventionally, in a wire bonder (wire bonding device) that connects, using a wire, an electrode (pad) on an IC chip being a first bonding point and a lead being a second bonding point, discharge is firstly caused by applying high voltage between a leading end of a wire fed from a capillary and a discharge electrode, and then, the leading end of the wire is melted with discharge energy, so that a ball is formed at the leading end of the wire having passed through the capillary. Here, a ball formed at a leading end of a wire with discharge is called an initial ball.

Figure 8:
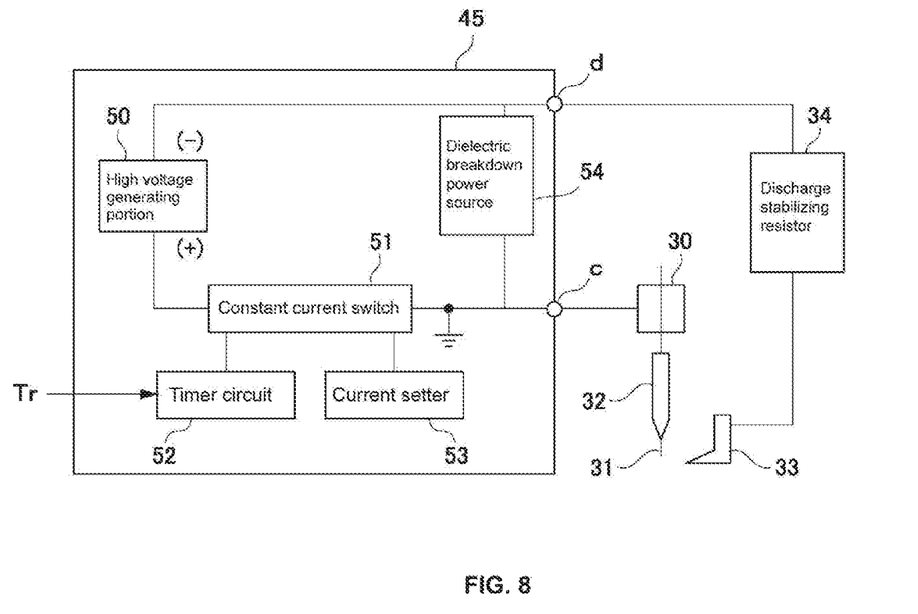
FIG. 8 is a block diagram illustrating a configuration of a conventional ball forming device for a wire bonder.

FIG. 8 is a block diagram illustrating a structure of a conventional ball forming device for a wide bonder for forming a ball at a leading end of a capillary by applying high voltage between a leading end of a wire fed from the capillary and a discharge electrode.

As illustrated in FIG. 8, a conventional ball forming device 45 for a wire bonder includes a dielectric breakdown power source 54 to generate high voltage for breaking insulation between a wire 31 and a discharge electrode 33, a high voltage generating portion 50 to generate high voltage for causing discharge current to flow after dielectric breakdown, and a constant current switch 51 to control discharge current flowing between the wire 31 at a leading end of a capillary 32 and the discharge electrode 33.

The dielectric breakdown power source 54 is configured to generate high voltage for breaking insulation between the wire 31 and the discharge electrode 33 and be turned off after dielectric breakdown. The high voltage generating portion 50 is configured to be turned on concurrently with the dielectric breakdown power source 54 at the time of dielectric breakdown between the wire 31 and the discharge electrode 33 and generate high voltage after the dielectric breakdown as well.

A positive electrode terminal (+) of the high voltage generating portion 50 is configured to apply positive electrode voltage to the wire 31 having passed through the capillary 32 as a bonding tool from a clamper 30 through the constant current switch 51.

Meanwhile, a negative electrode terminal (−) of the high voltage generating portion 50 is configured to apply negative electrode voltage to the discharge electrode 33. A discharge stabilizing resistor 34 for stabilizing discharge is arranged between the negative electrode terminal (−) of the high voltage generating portion 50 and the discharge electrode 33. As illustrated in FIG. 8, cables are arranged to connect the clamper 30 with a terminal c and the discharge electrode 33 including the discharge stabilizing resistor 34 with a terminal d.

As illustrated in FIG. 8, a timer circuit 52 is connected to the constant current switch 51 for controlling switching of a switch circuit (not illustrated) built in the constant current switch 51. A trigger signal Tr being a discharge start signal is to be provided to the timer circuit 52.

The timer circuit 52 has a timer for setting a discharge duration and the timer is activated by the trigger signal Tr provided from the outside. The timer circuit 52 is caused to be turned on by the trigger signal Tr, so that the switch circuit of the constant current switch 51 is closed and current flows between the wire 31 and the discharge electrode 33 after dielectric breakdown. After a lapse of the predetermined discharge duration, the timer circuit 52 is caused to be turned off, so that the switch circuit is opened and current is blocked. The constant current switch 51 is configured to cause constant current to flow between the discharge electrode 33 and the wire 31 while the tamer circuit 52 is kept on.

Magnitude of current flowing between the discharge electrode 33 and the wire 31 (hereinafter, called discharge current) is set by a current setter 53 connected to the constant current switch 51. The current setter 53 is structured, for example, with a variable adjustor and the like such as a trimmer and the like. Here, a discharge current value is defined in advance with respect to a resistance value. The constant current switch 51 performs controlling to cause predetermined discharge current to flow based on a resistance value of the current setter 53.

That is, the constant current switch 51 performs controlling so that discharge current of a constant value set by the current setter 53 flows between the discharge electrode 33 and the wire 31 after dielectric breakdown until discharge end.

According to the conventional ball forming device 45 for a wire bonder, a discharge current value of the current setter 53 and a discharge duration of the timer circuit 52 are selected by an operator to be appropriate in accordance with a wire diameter and an initial ball having a predetermined size is to be formed with the selected discharge current value and discharge duration.

In a ball forming device for a wire bonder disclosed in Patent Document 1, for stabilizing in forming an initial ball, a discharge duration from discharge start to discharge end of current flowing between a wire and a discharge electrode is divided into one or more blocks, a discharge current profile for each block is calculated with a specified function from a start current value, an end current value, and a discharge period in each block of the discharge duration, and discharge current is controlled based on the discharge current profiles of the respective blocks calculated at the time of discharge.

Patent Document 2 discloses a ball forming device for a wire bonder in which discharging is stabilized by arranging a fixed resistor for discharge stabilization between a torch electrode and a torch power source as being adjacent to the torch electrode.

CITED DOCUMENT

Patent Document

Patent Document 1: Japanese Patent Application Laid-Open No. 2009-277813
Patent Document 2: Japanese Patent Application Laid-Open No. 2001-156102

SUMMARY OF THE INVENTION

However, problems described in the following exist with the conventional ball forming devices. First, since only discharge current is controlled by a single constant current switch, discharge voltage is varied by air pressure of inert gas for preventing oxidization of a copper wire in ball forming, so that sparks cannot be maintained and initial ball forming is unstable.

Second, while an initial ball is formed, a wire is melt with discharge and grows to be the initial ball with discharge as being swung. Accordingly, swinging of the initial ball is prevented by finishing discharge while attenuating a current value during discharge using a parameter for sparks, so that decentering of the initial ball is suppressed. However, since voltage is decreased as well in accordance with current attenuation, discharge cannot be maintained to the end as being finished on the way. Consequently, there may be a case that initial ball forming is unstable.

Third, since a silver wire and a copper wire are used beside a gold wire as a wire for wire bonding, it is required to replace a cable incorporating a discharge stabilizing resistor for each wire kind so as to obtain appropriate discharge voltage and the like in accordance with a parameter for sparks. Further, replacing to a high-power ball forming device is required as well for performing various kinds of bonding using wires having different diameters.

In view of the above situations, it has been desired to stably form an initial ball by maintaining sparks even when discharge voltage is varied by air pressure of inert gas for preventing oxidization, decrease of discharge current, or the like.

Further, it has been desired that replacement of a cable incorporating a discharge stabilizing resistor is not required even when a wire kind is changed. Further, it has been desired that various kinds of wires and various kinds of bonding can be supported without replacing a ball forming device.

In view of the above, according to the present invention, a first current control circuit to control discharge current is arranged between a leading end of a wire and one electrode of a discharge continuing power source for causing discharge current to flow after dielectric breakdown, a second current control circuit to control shunting of discharge current is arranged between a discharge electrode and the other electrode of the discharge continuing power source, and a fixed resistor is connected to the second current control circuit in parallel as a shunt and controls current flowing through the current control circuit. Thus, an object of the present invention is to provide a ball forming device for a wire bonder capable of stably forming an initial ball and capable of being used with a silver wire and a copper wire as well as a gold wire.

To achieve the above object, the present invention provides a ball forming device for a wire bonder to cause discharge by applying high voltage between a leading end of a wire fed from a leading end of a capillary and a discharge electrode and forms a ball while the leading end of the wire is melted with energy of the discharge. Here, the ball forming device for a wire bonder includes a first current control circuit to control discharge current arranged between the leading end of the wire and one electrode of a discharge continuing power source for causing discharge current to flow after dielectric breakdown, a second current control circuit to control shunting of discharge current arranged between the discharge electrode and the other electrode of the discharge continuing power source, and a fixed resistor is connected to the second current control circuit in parallel as a shunt.

Further, according to a ball forming device for a wire bonder, a discharge voltage value between the leading end of the wire and the other electrode of the discharge continuing power source can be enlarged by decreasing current flowing through the second current control circuit, and the discharge voltage value can be lessened by increasing the current.

Further, according to a ball forming device for a wire bonder, the discharge voltage value is maintained constant just after dielectric breakdown until discharge is finished by controlling the current flowing through the second current control circuit.

Furthermore, according to a ball forming device for a wire bonder, discharge is maintained owing to that a discharge voltage value between the leading end of the wire and the other electrode of the discharge continuing power source is maintained constant while a discharge current value between the leading end of the wire and the discharge electrode is attenuated during discharge.

In view of the first problem, according to the present invention, the second current control circuit with the fixed resistor connected thereto in parallel is arranged on the discharge electrode side in addition to the existing current control circuit. When discharge voltage is set to be high, large part of discharge current is caused to flow through the fixed resistor by decreasing current flowing through the second current control circuit, so that the discharge voltage can be set high. In contrast, when the discharge voltage is set to be low, discharge current is caused not to flow through the fixed resistor by increasing current flowing through the second control circuit, so that the discharge voltage value can be equal to a voltage value in the conventional device. Thus, it is possible to adequately change the discharge voltage value.

Thus, according to the ball forming device for a wire bonder of the present invention, an appropriate discharge voltage value can be continuously selected. Accordingly, discharge can be performed even under conditions with blowing of inert gas and an initial ball can be stably formed.

Further, in view of the second problem, according to the ball forming device for a wire bonder of the present invention, owing to that a discharge voltage value is maintained constant even when a current value is varied during discharge, even with parameters causing current attenuation, voltage decrease in accordance with the current attenuation can be prevented. Accordingly, discharge can be continued all the way and an initial ball can be stably formed while suppressing decentering of the initial ball.

Further, in view of the third problem, according to the ball forming device for a wire bonder of the present invention, the first current control circuit to control discharge current is arranged between the leading end of the wire and one electrode of the discharge continuing power source, and further, the second current control circuit to control shunting of discharge current is arranged between the discharge electrode and the other electrode of the discharge continuing power source. According to the above, since generated heat with current from the circuits is scattered and current limitation due to heat generation is relieved, it is possible to provide higher power.

According to the above, the setting range for spark parameters is enlarged and bonding can be performed without replacing a cable even when a wire material is changed. Further, a variety of bonding can be performed without replacing the ball forming device.

EMBODIMENTS OF THE INVENTION

In the following, description will be provided on embodiments of a ball forming device for a wire bonder of the present invention with reference to the drawings. In the ball forming device for a wire bonder of the present invention, a first current control circuit to control discharge current is arranged between a leading end of a wire and one electrode of a discharge continuing power source, a second current control circuit to control shunting of discharge current is arranged between a discharge electrode and the other electrode of the discharge continuing power source, and a fixed resistor is connected to the second current control circuit in parallel as a shunt and controls current flowing through the current control circuit. Thus, the ball forming device for a wire bonder is capable of stably forming an initial ball and capable of being used with a silver wire and a copper wire as well as a gold wire.

Figure 1:
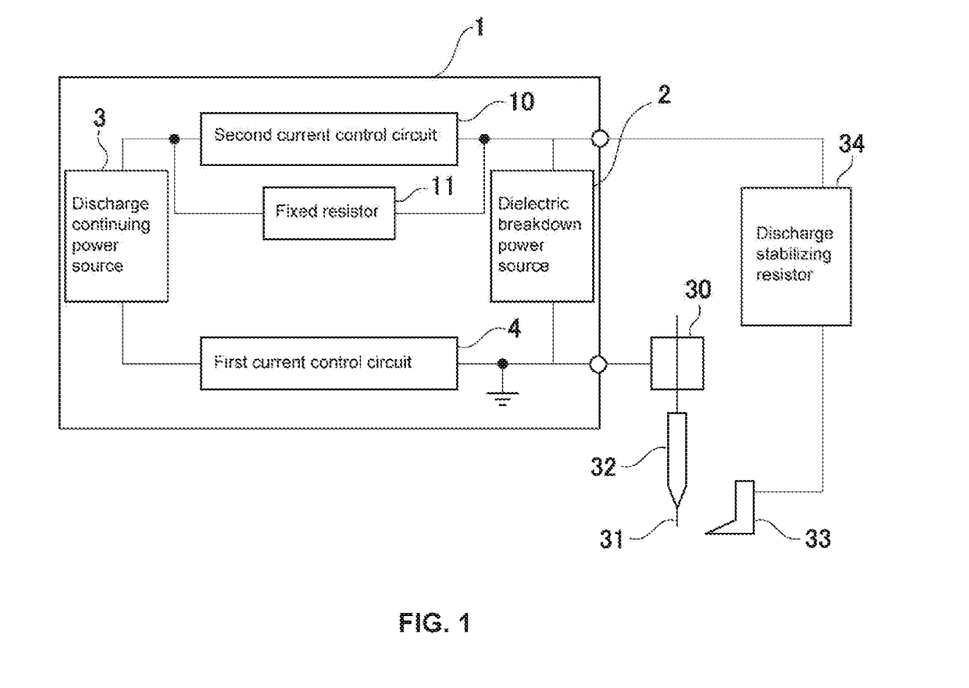
FIG. 1 is a block diagram illustrating a configuration of a ball forming device for a wire bonder of the present invention.
Figure 2:
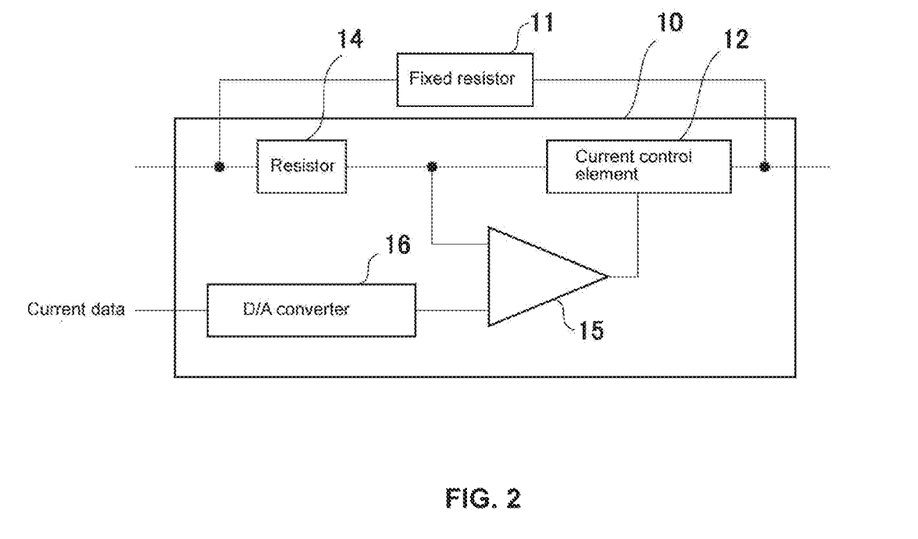
FIG. 2 is a block diagram illustrating a configuration of a second current control circuit of the ball forming device for a wire bonder.
Figure 3:
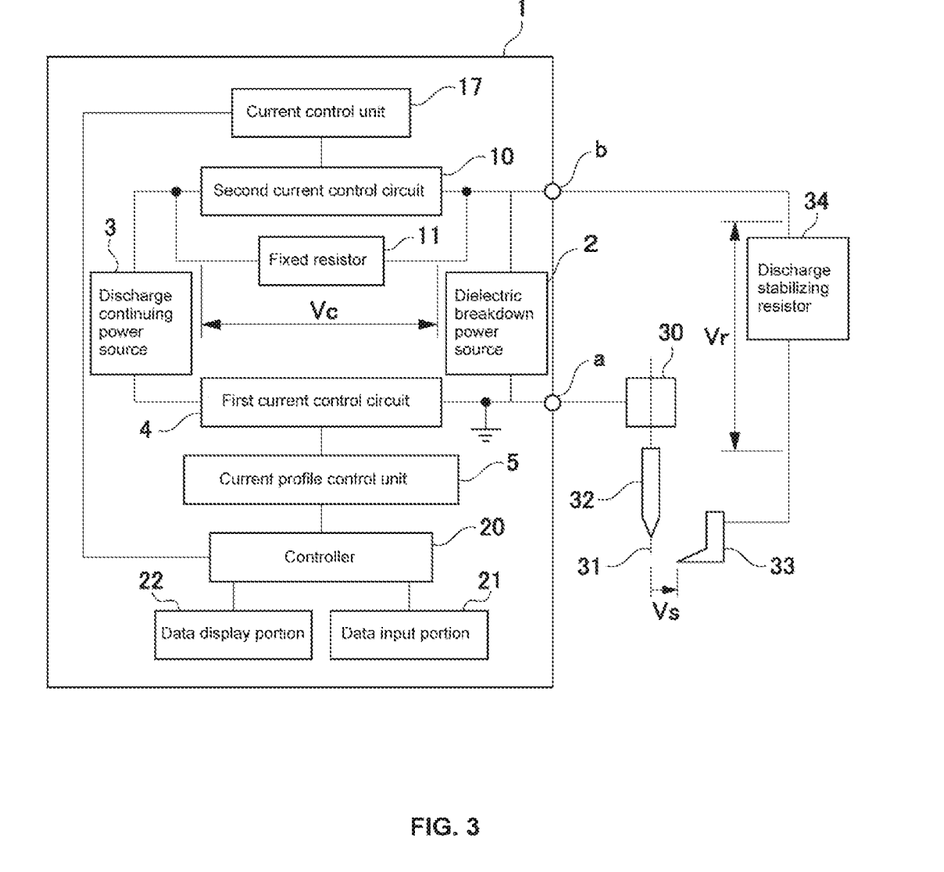
FIG. 3 is a block diagram illustrating control units for the first current control circuit and the second current control circuit.

FIG. 1 is a block diagram illustrating a configuration of a ball forming device for a wire bonder of the present invention. FIG. 2 is a block diagram illustrating a configuration of a second current control circuit of the ball forming device for a wire bonder. FIG. 3 is a block diagram illustrating control units for the first current control circuit and the second current control circuit. Here, the same reference is given to a component having the same function and structure as those in the conventional device illustrated in FIG. 8 and detailed description thereof will be skipped.

[Configuration of a Ball Forming Device for a Wire Bonder]

As illustrated in FIG. 1, a ball forming device 1 for a wire bonder includes a dielectric breakdown power source 2 to generate high voltage for breaking insulation between a wire 31 and a discharge electrode 33, a discharge continuing power source 3 to generate high voltage for causing discharge current to flow after dielectric breakdown, a first current control circuit 4 to control discharge current flowing between the wire 31 at a leading end of a capillary 32 and the discharge electrode 33, a second current control circuit 10 located between the other electrode of the discharge continuing power source 3 via a discharge stabilizing resistor 34, and a fixed resistor 11 connected to the second current control circuit 10 in parallel.

The dielectric breakdown power source 2 is configured to generate high voltage for breaking insulation between the wire 31 and the discharge electrode 33 and be turned off after dielectric breakdown. The discharge continuing power source 3 is configured to be turned on concurrently with the dielectric breakdown power source 2 at the time of dielectric breakdown between the wire 31 and the discharge electrode 33 and generate high voltage after the dielectric breakdown as well. Here, high voltage for breaking insulation between the wire 31 and the discharge electrode 33 is generated with a combination of the dielectric breakdown power source 2 and the discharge continuing power source 3. However, it is also possible to generate high voltage only with the discharge continuing power source 3 without using the dielectric breakdown power source 2.

The first current control circuit 4 performs controlling to cause specific discharge current to flow between the wire 31 and the discharge electrode 33 after dielectric breakdown between the leading end of the wire 31 and the discharge electrode 33.

The second current control circuit 10 causes specific current to flow whip controlling shunting of discharge current. The current control range of the second current control circuit 10 is between the minimum value being zero (in a state that current is blocked) and the maximum value being a discharge current value flowing between the wire 31 and the discharge electrode 33.

The fixed resistor 11 is connected to the second current control circuit 10 in parallel as a shunt. Here, the fixed resistor 11 being the shunt connected to the second current control circuit 10 in parallel divides discharge current with respect to the second current control circuit 10 and causes the divided current to flow therethrough.

According to the above, discharge current flows as being divided toward the second current control circuit 10 and the fixed resistor 11. Controlled current flows through the second current control circuit 10 and the remaining current of the discharge current flows through the fixed resistor 11. For example, when it is controlled that current being 10 mA flows through the second current control circuit 10 out of the discharge current being 30 mA, shunt current being 20 mA flows through the fixed resistor 11.

Next, description will be provided on a configuration of the second current control circuit with reference to FIG. 2. FIG. 2 is a block diagram illustrating the configuration of the second current control circuit in the ball forming device for a wire bonder.

As illustrated in FIG. 2, the second current control circuit 10 includes a current control element 12 to control magnitude of discharge current flowing through the second control circuit 10, a resistor 14 for detecting current flowing through the second control circuit 10, a comparator 15 to compare a current value detected at the resistor 14 and an analog value of current data output from a current control unit 17 (illustrated in FIG. 3) and output a difference therebetween to the current control element 12, and a D/A converter 16 to convert current data output from the current control unit 17 into an analog value and output the analog value to the comparator 15. Here, a field effect transistor (FET) or the like may be adopted as the current control element 12.

Thus, the current value flowing through the second current control circuit 10 is controlled based on the current data output from the current control unit 17.

In the following, description will be provided on a configuration and operation of each control unit of the first current control circuit and the second current control circuit in the ball forming device for a wire bonder with reference to FIG. 3.

As illustrated in FIG. 3, the ball forming device 1 for a wire bonding includes a current profile control unit 5 to control the first current control circuit 4, and the current control unit 17 to control the second current control circuit 10. The current profile control unit 3 and the current control unit 17 are controlled by a controller 20. The controller 20 includes a computer having an arithmetic unit, a storage unit, and the like. Control programs are stored at the storage unit.

A data display portion 22 and a data input portion 21 are connected to the controller 20. The data display unit 22 displays a menu for preparing a discharge current profile and the like, and input data. The data input portion 21 is for inputting data for preparing the discharge current profile, data of a material of the wire 31, data of an initial ball diameter, and the like.

Further, the controller 20 stores discharge current values, discharge durations, and discharge voltage values in a table form in accordance with initial ball diameters for each material of the wire 31. Further, the controller 20 also stores data for preparing a discharge current profile for controlling discharge current.

[Calculation of Discharge Current]

A value of discharge current flowing between the wire 31 and the discharge electrode 33 is calculated based on the discharge current profile. The calculated discharge current value is output from the current profile control unit 5. The discharge current profile represents a relation of discharge current with respect to discharge time with a previously specified function of a discharge start current value, a discharge end current value, and a discharge duration.

For example, when the specified function is a linear function, the discharge current profile is defined as a linear equation passing through the discharge start current value at the time of discharge start and the discharge end current value at the time of discharge end. The equation represents the relation of discharge current with respect to discharge time, so that a discharge current value at each discharge time can be obtained through the equation.

The controller 20 calculates a discharge current value from the discharge current profile and stores, at a memory of the current profile control unit 5, discharge current data calculated for each step (e.g., 0.1 msec) of the discharge duration from discharge start to discharge end.

The current profile control unit 5 includes the memory to store discharge current data, a D/A converter to convert digital data of discharge current values sequentially output from the memory into an analog signal, and a counter to sequentially read data of a timer and the memory.

According to the above, the first current control circuit 4 sequentially controls discharge current flowing between the wire 31 located at the leading end of the capillary 32 and the discharge electrode 33 based on the data from the current profile control unit 5.

The first current control circuit 4 incorporates a switch circuit (not illustrated) that causes high voltage of the discharge continuing power source 3 to be applied to the wire through a clamper 30.

Further, the first current control circuit 4 includes a current detecting portion (not illustrated) to check whether discharge current has flown with insulation between the wire 31 and the discharge electrode 33 broken after the high voltage is applied to the wire 31 with the switch circuit operated.

Here, current is controlled to flow based on the data from the current profile control unit 5 after current is detected by the current detecting portion. When the data from the current profile control unit 5 is zero, the first current control circuit 4 controls current not to flow between the wire 31 and the discharge electrode 33.

Further, the controller 20 searches a table from data such as a material of the wire 31 and a diameter of an initial hall input through the data input portion 21 and calculates magnitude of discharge current, a discharge duration, a discharge voltage value, and the like.

The magnitude of discharge current, the discharge duration, the discharge voltage value, and the like calculated by the controller 20 are output to the current control unit 17 that controls the second current control circuit 10. The current control unit 17 includes an arithmetic unit and a storage unit (memory) and calculates a value of current caused to flow through the second current control circuit 10 from the magnitude of discharge current, the discharge duration, and the discharge voltage value. Further, the current control unit 17 includes a unit to measure between terminals a, b in FIG. 3.

[Condition Setting for Ball Forming]

Figure 4:
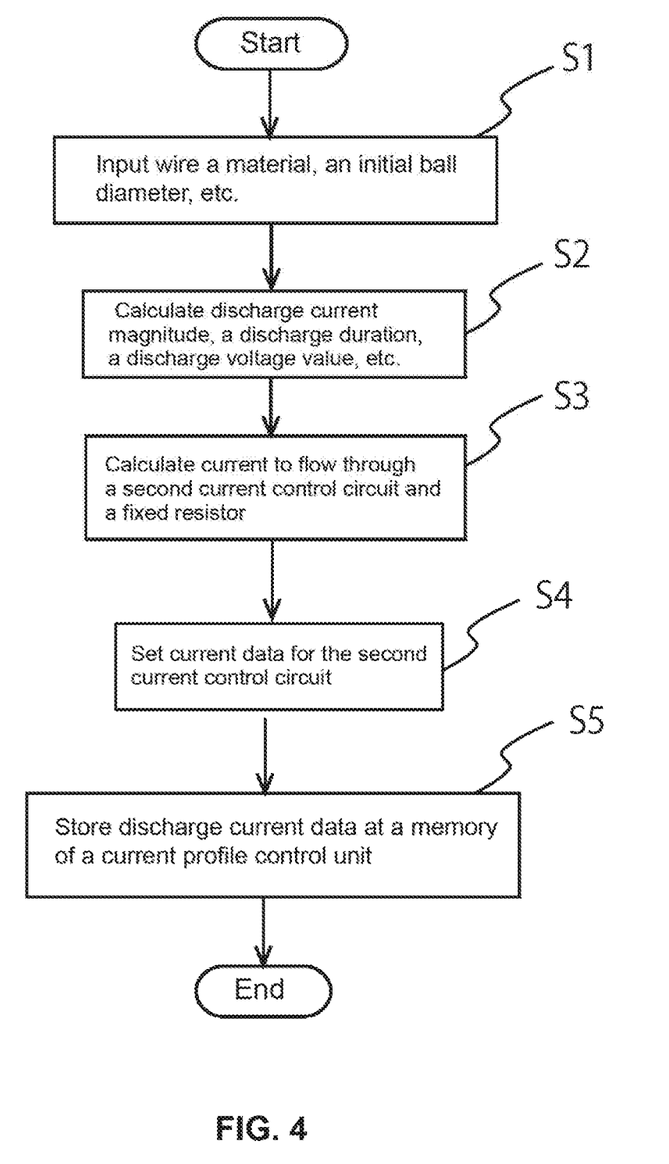
FIG. 4 is a flowchart illustrating condition setting for ball forming.

Next, description will be provided on condition setting for ball forming with reference to FIGS. 3 and 4. FIG. 4 is a flowchart illustrating condition setting for ball forming.

[Discharge Voltage Value]

Due to the nature of discharge, discharge is more apt to occur with increase of a resistance value of the discharge stabilizing resistor 34 built in a cable. That is, for causing discharge current having the same current value to flow, discharge is more apt to be maintained discharge can be performed more stably with a larger resistance value including the discharge stabilizing resistor 34 and the fixed resistor 11 at the second current control circuit 10.

Owing to that a discharge voltage value (also called a discharge maintaining voltage value) is continuously kept large, it is possible to obtain high capability to maintain discharge. Here, the discharge voltage value represents a voltage value obtained by adding values of voltage (Vr in FIG. 3) generated at the discharge stabilizing resistor 34 due to flowing of discharge current, voltage (Vs in FIG. 3) between the leading end of the wire 31 and the discharge electrode 33, and voltage (Vc in FIG. 3) generated at the fixed resistor 11.

Next, description will be provided on condition setting for ball forming with reference to FIG. 4. First, conditions of an initial ball are input through the data input portion 21 (step S1). For example, a material of the wire 31, an initial ball diameter, and the like are input.

The controller 20 calculates magnitude of discharge current, a discharge voltage value, and the like are calculated from the initial ball conditions input through the data input portion 21 (step S2). For example, the calculation is performed by searching a table, previously prepared in a table form, of discharge current values, discharge durations, and discharge voltage values in accordance with initial ball diameters for each material of the wire 31. Here, the discharge voltage value calculated from the initial ball conditions is represented by Vss.

Values of current to be caused to flow through the second current control circuit 10 and the fixed resistor 11 are calculated from the discharge current value, the discharge duration, and the discharge voltage value (step S3). The values of current to be caused to flow through the second current control circuit 10 and the fixed resistor 11 are calculated in the following procedure.

The voltage between the terminals a, b in FIG. 3 has a value obtained by adding the voltage value Vs between the leading end of the wire 31 and the discharge electrode 33 and the voltage value Vr generated at the discharge stabilizing resistor 34.

Accordingly, the voltage value at the second current control circuit 10 (the voltage value Vc generated at the fixed resistor 11) is obtained by subtracting the voltage value between the terminals a, b from the discharge voltage value Vss. Current caused to be flow through the second current control circuit 10 and the fixed rest 11 is calculated based on the voltage value at the second current control circuit 10.

Here, as an example, the resistance value of the fixed resistor 11 is set to 20 kΩ, the discharge current value is set to 30 mA, the voltage value between the terminals a, b in FIG. 3 is set to 500 V, and the discharge voltage value Vss is set to 700 V. In this case, the voltage at the fixed resistor 11 being a value obtained by subtracting the voltage value between the terminals a, b in FIG. 3 from the discharge voltage value Vss becomes 200 V.

According to the above, the current control unit 17 performs control that current of 20 mA flows through the second current control circuit 10 and current of 10 mA flows through the fixed resistor 11. Owing to that current of 10 mA flows through the fixed resistor 11, voltage of 200 V is generated at the fixed resistor 11.

Subsequently, the current control unit 17 sets current data for the second current control circuit 10 from the calculated current value of the fixed resistor 11 (step S4). In the above example, the current data being 20 mA is set for the second current control circuit 10.

Further, the controller 20 calculates discharge current from the discharge current profile and stores data of the discharge current calculated for each step of the discharge duration from discharge start to discharge end at the memory of the current profile control unit 5 (step S5).

Thus, current to be caused to flow through the second current control circuit 10 is determined for maintaining the discharge voltage value during discharge.

[Control of Discharge Voltage Value]

Figure 5:
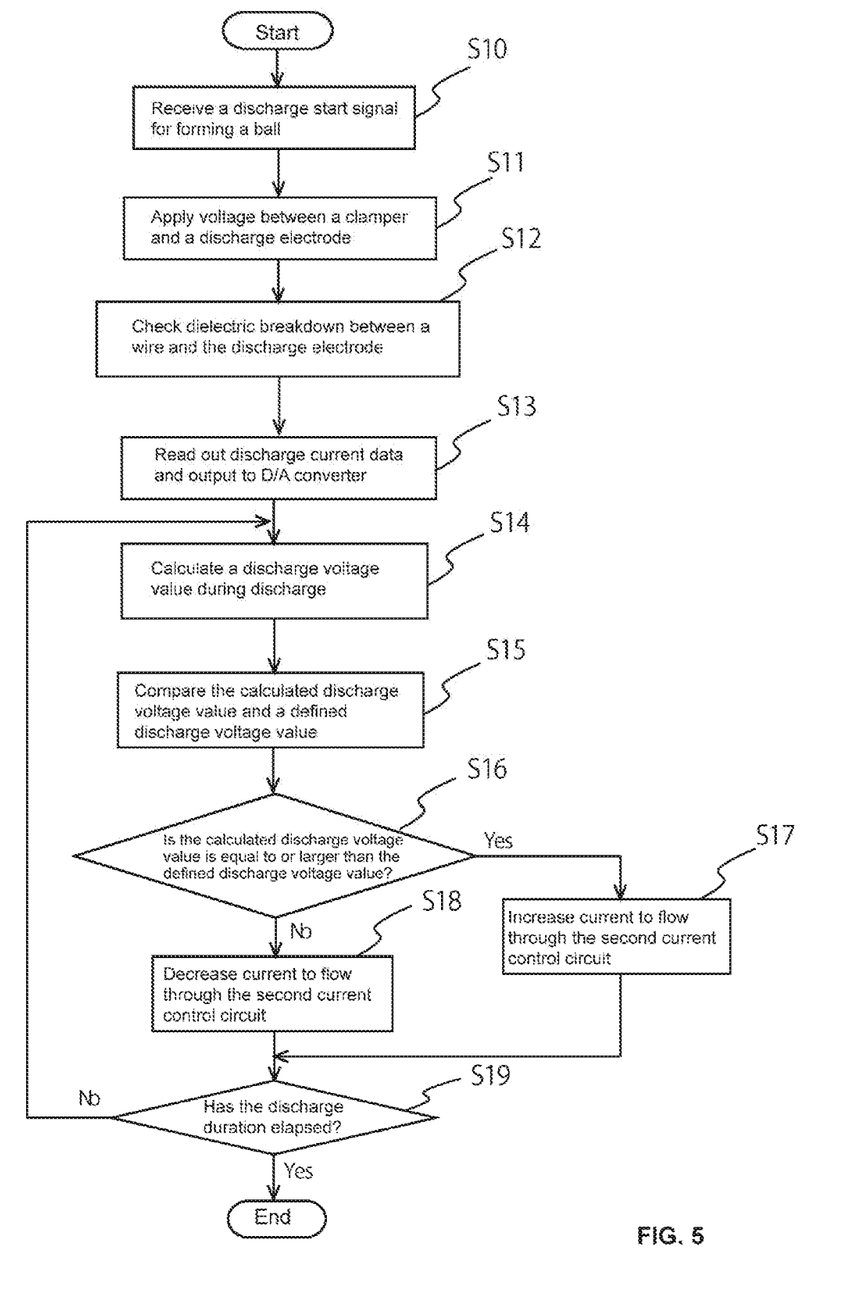
FIG. 5 is a flowchart illustrating control of discharge voltage in ball forming.

Next, description will be provided on control of discharge current in ball forming with reference to FIG. 5. FIG. 5 is a flowchart illustrating control of discharge voltage in ball forming. As illustrated in FIG. 5, a controller of a wire bonder (not illustrated) outputs a trigger signal being a discharge start signal for forming a ball to the controller 20 of a ball forming device for the wire bonder (step S10).

After the trigger signal is received, the controller 20 first applies high voltage of the dielectric breakdown power source 2 and the discharge continuing power source 3 between the clamper 30 holding the wire 31 and the discharge electrode 33 (step S11). Here, the high voltage of the discharge continuing power source 3 is applied owing to that the switch circuit built in the first current control circuit 4 is turned on.

Subsequently, at the first current control circuit 4, the current detecting portion checks whether current has flown with insulation between the wire 31 and the discharge electrode 33 broken due to the high voltage of the dielectric breakdown power source 2 and the discharge continuing power source 3 (step S12).

After the current detecting portion confirms that discharge current has flown due to dielectric breakdown, the dielectric breakdown power source 2 is turned off. Meanwhile, the discharge continuing power source 3 continuously applies high voltage. The current profile control unit 5 activates the counter of a memory address with a clock signal of the timer, reads out data, stored in the memory, of the discharge current with respect to discharge time, and outputs the data to the built-in D/A converter (step S13).

Thus, the applied high voltage causes dielectric breakdown between the leading end of the wire 31 and the discharge electrode 33, and after the dielectric breakdown, discharge current flows through the first current control circuit 4 based on the set data of discharge current.

Subsequently, the current control unit 17 performs calculation of the discharge voltage value during discharge (step S14). As the calculation of the discharge voltage value, first, voltage between the terminals a, b in FIG. 3 is measured. For measuring the voltage, a high resistance and a low resistance (not illustrated) are connected in series between the terminals a, b in FIG. 3, voltage generated at the low resistance is converted into a digital value by an A/D converter (not illustrated), and the digital value is read out. The voltage between the terminals a, b is calculated from the read-cut digital value based on a ratio between the high resistance and the low resistance.

Subsequently, voltage generated at the fixed resistor 11 is calculated from the current flowing through the fixed resistor 11 calculated in step S3 in FIG. 4. Then, the discharge voltage value is calculated by adding the voltage between the terminals a, b to the calculated voltage at the fixed resistor 11. Here, the calculated discharge voltage value is denoted by Vsc while measuring the voltage between the terminals a, b in FIG. 3.

Then, comparison is performed between the calculated discharge voltage value Vsc and the discharge voltage value Vss defined in condition setting illustrated in FIG. 4 (step S15). When the calculated discharge voltage value Vsc is equal to or larger than the defined discharge voltage value Vss (Yes, in step S16), current flowing through the second current control circuit 10 is controlled to be increased (step S17). Accordingly, current flowing through the fixed resistor 11 is decreased and voltage generated at the fixed resistor 11 is lowered.

Thus, the discharge voltage value Vsc is lowered and corrected to be equal to the defined discharge voltage value Vss. After the current flowing through the second current control circuit 10 is increased, it proceeds to step S19.

On the other hand, when the calculated discharge voltage value Vsc is smaller than the defined discharge voltage value Vss (No, in step S16), current flowing through the second current control circuit 10 is controlled to be decreased (step S18). Accordingly, current flowing through the fixed resistor 11 is increased and voltage generated at the fixed resistor 11 is heightened. Thus, the discharge voltage value Vsc is heightened and corrected to be equal to the defined discharge voltage value Vss.

Subsequently, it is determined whether the discharge duration has elapsed (step S19). When the discharge duration has not elapsed (No, in step S19), operation from step S14 is repeated.

On the other hand, when the discharge duration has elapsed (Yes, in step S19), the discharge operation is stopped and finished.

As described above, since the discharge voltage value is checked during discharge, the discharge voltage value is controlled to be constant, even when the discharge voltage value is fluctuated, by varying the current value flowing through the fixed resistor 11 due to the second current control circuit 10.

[Control of Discharge Voltage Value in Attenuation of Discharge Current]

According to the ball forming device for a wire bonder of the present invention, even with attenuation of the discharge current value between a leading end of a wire and a discharge electrode during discharge, discharge can be stably maintained by controlling a discharge voltage value constant between the leading end of the wire and the other end of the discharge continuing power source.

Figure 6A:
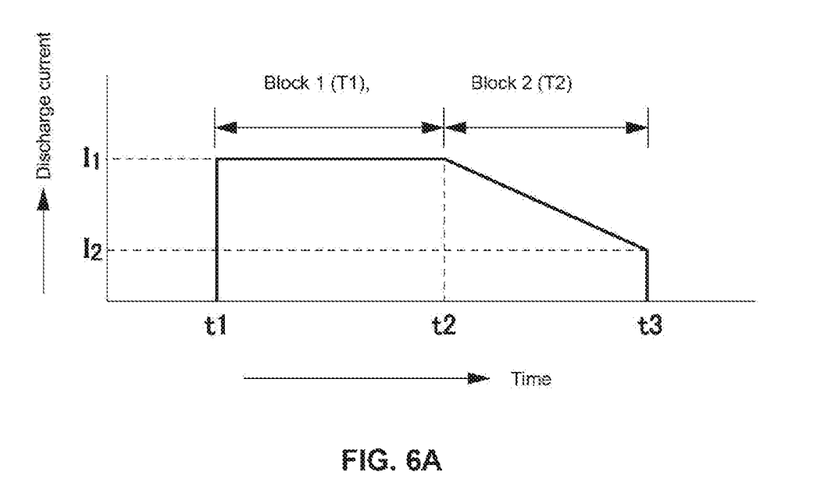
FIG. 6A is a graph illustrating set values of discharge current with respect to discharge time in initial ball forming and FIG. 6B is a graph illustrating variation of discharge voltage values with respect to discharge time.
Figure 6B:
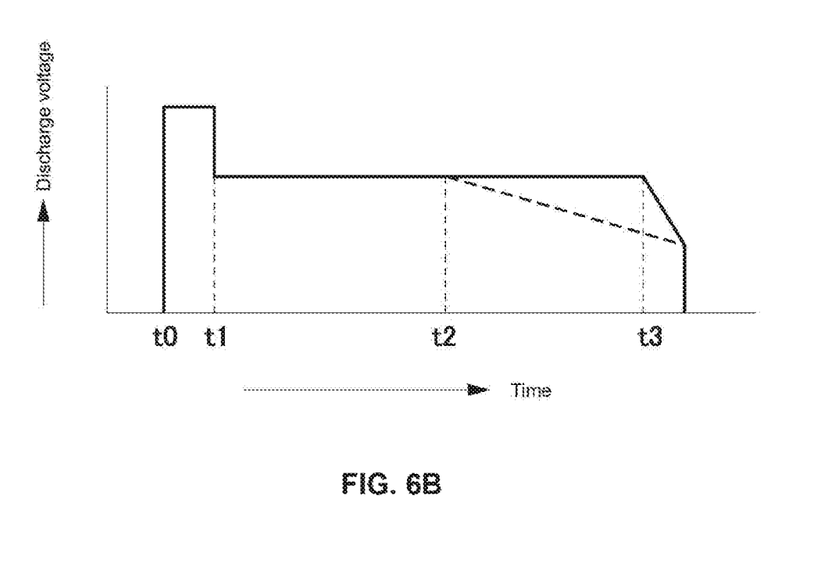
Figure 7:
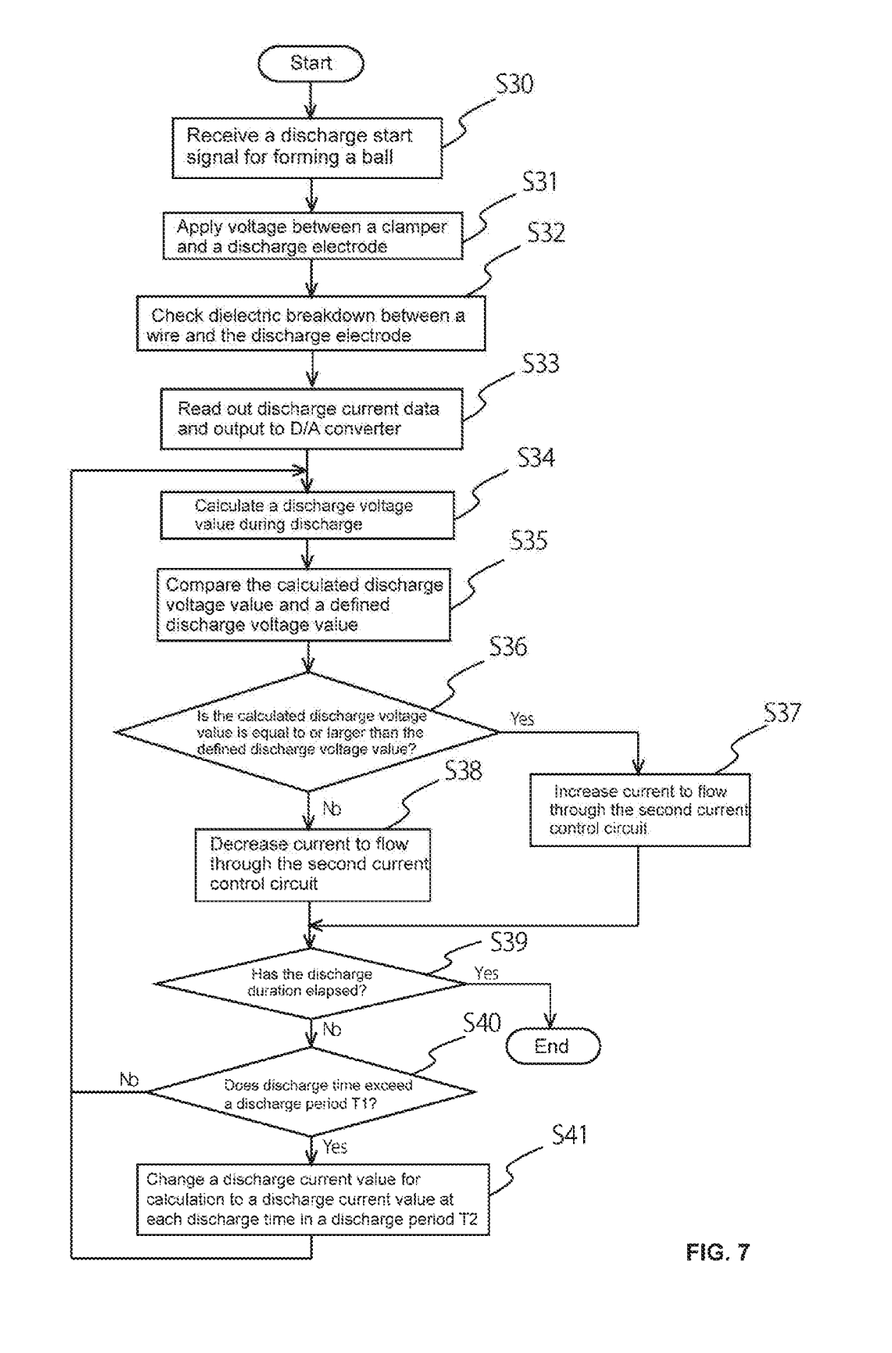
FIG. 7 is a flowchart illustrating control of discharge voltage of FIG. 6 in ball forming.

Next, description will be provided with reference to FIGS. 6 and 7 on attenuation control, that is, control to maintain discharge current constant in an early half of the discharge duration and to gradually decrease discharge current in a latter half of the discharge duration. FIG. 6A is a graph illustrating set values of discharge current with respect to discharge time in initial ball forming and FIG. 6B is a graph illustrating variation of discharge voltage values with respect to discharge time. FIG. 7 is a flowchart illustrating control of discharge voltage of FIG. 6A in ball forming.

As illustrated in FIG. 6A, discharge current is kept at a constant value from discharge time t1 to discharge time t2 and is gradually decreased from discharge time t2 to discharge time t3. In FIG. 6A, a range from discharge time t1 to discharge time t2 is represented by block 1 and a discharge period at block 1 is represented by T1. Further, a range from discharge time t2 to discharge time t3 is represented by block 2 and a discharge period at block 2 is represented by T2.

As a discharge action in FIG. 6A, after discharge time exceeds the discharge period T1 at block 1, discharge current is controlled using a discharge current profile at block 2. The discharge current profile at block 2 is defined so that current flowing through the first current control circuit 4 is caused to be decreased.

Discharge current flowing between the wire 31 and the discharge electrode 33 is determined in accordance with discharge current data calculated by the current profile control unit 5 based on the discharge current profile.

The discharge current profile defines the relation of charge current with respect to discharge time in each block. Here, the discharge duration from discharge start to discharge end is divided into a plurality of blocks. In FIG. 6A, the discharge duration is divided into two blocks. A relational equation of the discharge current profile in each block is defined with a previously specified function of a start current value, an end current value, and a discharge period.

For example, when the specified function is a linear function, the discharge current profile is defined as a linear equation passing through the start current value at the start of the discharge period and the end current value at the end of the discharge period in each block of the discharge duration. The equation of each block defines the relation of discharge current with respect to discharge time. Here, a discharge current value at each discharge time can be calculated from the equation of the block corresponding to the discharge time.

The controller 20 stores discharge current values, discharge durations, and discharge voltage values in table forms in accordance with initial ball diameters for each material of the wire 31. Further, the controller 20 also stores data for preparing a discharge current profile for controlling discharge current. Further, the controller 20 searches a table from data such as a material of the wire 31 and a diameter of an initial ball input through the data input portion 21 and calculates magnitude of discharge current, a discharge duration, a discharge voltage value, and the like.

The magnitude of discharge current, the discharge duration, the discharge voltage value, and the like calculated by the controller 20 are output to the current control unit 17 that controls the second current control circuit 10. Since the magnitude of discharge current is not constant, data of discharge current is stored for each discharge time at the memory of the second current control circuit 10.

The controller 20 calculates a discharge current value from the discharge current profile of each block and stores, at the memory of the current profile control unit 5, discharge current data calculated for each step (e.g., 0.1 msec) of the discharge duration from discharge start to discharge end.

Next, description will be provided on control of discharge current in FIG. 6A in ball forming with reference to FIG. 7. As illustrated in FIG. 7, the controller of the wire bonder (not illustrated) outputs a trigger signal being a discharge start signal for forming a ball to the controller 20 of the ball forming device for the wire bonder and the controller 20 receives the discharge start signal (step S30).

After the trigger signal is received, the controller 20 first applies high voltage of the dielectric breakdown power source 2 and the discharge continuing power source 3 between the clamper 30 holding the wire 31 and the discharge electrode 33 (step S31). Here, the high voltage of the discharge continuing power source 3 is applied owing to that the switch circuit built in the first current control circuit 4 is turned on.

Subsequently, at the first current control circuit 4, the current detecting portion checks whether current has flown with insulation between the wire 31 and the discharge electrode 33 broken due to the high voltage of the dielectric breakdown power source 2 and the discharge continuing power source 3 (step S32).

After the current detecting portion confirms that discharge current has flown due to dielectric breakdown, the dielectric breakdown power source 2 is turned off. Meanwhile, the discharge continuing power source 3 continuously applied high voltage. The current profile control unit 5 activates the counter of a memory address with a clock signal of the timer, reads out data, stored in the memory, of the discharge current with respect to discharge time, and outputs the data to the built-in D/A converter (step S33).

Thus, the applied high voltage causes dielectric breakdown between the leading end of the wire 31 and the discharge electrode 33, and after the dielectric breakdown, discharge current flows through the first current control circuit 4 based on the set data of discharge current.

Subsequently, the current control unit 17 performs calculation of the discharge voltage value Vsc during discharge (step S34). As the calculation of the discharge voltage value, first, voltage between the terminals a, b in FIG. 3 is measured. Here, measurement of the voltage is the same as that in step S14 of FIG. 5 and description thereof will be skipped.

Then, comparison is performed between the calculated discharge voltage value Vsc and the discharge voltage value Vss defined in condition setting illustrated in FIG. 4 (step S35). When the calculated discharge voltage value Vsc is equal to or larger than the defined discharge voltage value Vss (Yes, in step S36), current flowing through the second current control circuit 10 is controlled to be increased (step S37). Accordingly, current flowing through the fixed resistor 11 is decreased and voltage generated at the fixed resistor 11 is lowered.

On the other hand, when the calculated discharge voltage value Vsc is smaller than the defined discharge voltage value Vss (No, in step S36), current flowing through the second current control circuit 10 is controlled to be decreased (step S38). Accordingly, current flowing through the fixed resistor 11 is increased and voltage generated at the fixed resistor 11 is heightened.

Subsequently, it is determined whether the discharge duration has not elapsed (step S39). When the discharge duration has elapsed (Yes, in step S39), the discharge operation is stopped and finished.

On the other hand, when the discharge duration has not elapsed (No, in step S39), it is determined whether the discharge time exceeds the discharge period T1 (step S40). As illustrated in FIG. 6A, discharge current is decreased in the discharge period T2 from discharge time t2 after a lapse of the discharge period T1. In step S40, it is determined whether the discharge time is in a range of block 2.

When the discharge time exceeds the discharge period T1 (Yes, in step S40), the discharge current value for calculating current to flow through the second current control circuit 10 is changed to a discharge current value at each discharge time in the discharge period T2 (step S41).

In step S41, data of discharge current at each discharge time stored in the memory of the second current control circuit 10 is read out. Then, it proceeds to step S34.

On the other hand, when the discharge time does not exceed the discharge period T1 (No, in step S40), it proceeds to step S34.

FIG. 6B is a graph illustrating variation of a discharge voltage value with respect to discharge time. As illustrated in FIG. 6B, the discharge voltage value from discharge time t0 to t1 causes dielectric breakdown to occur, and the discharge voltage value from discharge time t1 to t2 at block 1 is constant. Further, the discharge voltage value from discharge time t2 to t3 at block 3 is maintained constant as illustrated by a solid line even though the discharge current is attenuated.

A bold dotted line at block 2 indicates variation of a discharge current value with a conventional ball formed device. Here, a discharge voltage value is decreased with decrease of discharge current.

Thus, the current control unit 17 performs control so that the discharge voltage value is maintained constant even when discharge current is decreased. For example, the voltage between the terminals a, b in FIG. 3 is decreased with decrease of discharge current.

Here, current to flow through the second current control circuit 10 is caused to be decreased to increase current to flow through the fixed resistor 11, so that voltage generated at the fixed resistor 11 is heightened. Accordingly, the discharge voltage value can be maintained at a constant value, that is, at a continuously large value, so that capability to maintain discharge can be enhanced.

As described above, according to the present invention, the second current control circuit with the fixed resistor connected thereto in parallel is arranged on the discharge electrode side in addition to the existing current control circuit. When discharge voltage is set to be high, large part of discharge current is caused to flow through the fixed resistor by decreasing current flowing through the second current control circuit, so that the discharge voltage can be set high.

In contrast, when the discharge voltage is set to be low, discharge current is caused not to flow through the fixed resistor by increasing current flowing through the second control circuit, so that the discharge voltage value can be equal to a voltage value in the conventional device. Thus, it is possible to adequately change the discharge voltage value.

As described above, according to the ball forming device for a wire bonder of the present invention, an appropriate discharge voltage value can be continuously selected. Accordingly, discharge can be performed even under conditions with blowing of inert gas and an ball can be stably formed.

Further, according to the ball forming device for a wire bonder of the present invention, owing to that a discharge voltage value is maintained constant even when a current value is varied during discharge, even with parameters causing current attenuation, voltage decrease in accordance with the current attenuation can be prevented. Accordingly, discharge can be continued all the way and an initial ball can be stably formed while suppressing decentering of the initial ball.

Further, according to the ball forming device for a wire bonder of the present invention, the first current control circuit to control discharge current is arranged between the leading end of the wire and one electrode of the discharge continuing power source, and further, the second current control circuit to control shunting of discharge current is arranged between the discharge electrode and the other electrode of the discharge continuing power source. According to the above, since generated heat with current from the circuits is scattered and current limitation due to heat generation is relieved, it is possible to provide higher power.

According to the above, the setting range for spark parameters is enlarged and bonding can be performed without replacing a cable even when a wire material is changed. Further, a variety of bonding can be performed without replacing the ball forming device.

The present invention can be actualized in various types without departing from substantial characteristics thereof. The abovementioned embodiments are simply for explanation and are not intended to limit the present invention.

EXPLANATION OF REFERENCES

1 Ball forming device for wire bonder
2 Dielectric breakdown power source
3 Discharge continuing power source
4 First current control circuit
5 Current profile control unit
10 Second current control circuit
11 Fixed resistor
12 Current control element (FBI)
14 Resistor
15 Comparator
16 D/A converter
17 Current control unit
20 Controller
21 Data input portion
22 Data display portion
30 Clamper
31 Wire
32 Capillary
33 Discharge electrode
34 Discharge stabilizing resistor
45 Ball forming device for wire bonder
50 High voltage generating portion
51 Constant current switch
52 Timer circuit
53 Current setter
54 Dielectric breakdown power source

The invention claimed is:

1. A ball forming device for a wire bonder to cause discharge by applying high voltage between a leading end of a wire fed from a leading end of a capillary and a discharge electrode and forms a ball while the leading end of the wire is melted with energy of the discharge, comprising:
 a discharge continuing power source for causing discharge current to flow after dielectric breakdown and comprising one electrode and other electrode;
 a first current control circuit arranged between the leading end of the wire and the one electrode of the discharge continuing power source, the first current control circuit configured to control the discharge current;
 a second current control circuit arranged between the discharge electrode and the other electrode of the discharge continuing power source, the second current control circuit configured to control shunting of the discharge current; and a fixed resistor connected to the second current control circuit in parallel as a shunt, wherein the ball forming device is configured to control a discharge voltage value between the leading end of the wire and the other electrode of the discharge continuing power source by controlling current flowing through the second current control circuit.

2. The ball forming device for the wire bonder according to claim 1, wherein the discharge voltage value is enlarged by decreasing the current flowing through the second current control circuit, and the discharge voltage value is lessened by increasing the current flowing through the second current control circuit.

3. The ball forming device for the wire bonder according to claim 2, wherein the discharge voltage value is maintained constant just after dielectric breakdown until discharge is finished by controlling the current flowing through the second current control circuit.

4. The ball forming device for the wire bonder according to claim 1, wherein discharge is maintained owing to that the discharge voltage value between the leading end of the wire and the other electrode of the discharge continuing power source is maintained constant while a discharge current value between the leading end of the wire and the discharge electrode is attenuated during the discharge.

5. The ball forming device for the wire bonder according to claim 1, wherein the second current control circuit includes a current control element configured to control magnitude of the current flowing through the second control circuit.

6. The ball forming device for the wire bonder according to claim 1, wherein the ball forming device simultaneously utilizes the first current control circuit and the second current control circuit.

* * * * *